(12) United States Patent
Adkisson et al.

(10) Patent No.: US 9,892,958 B2
(45) Date of Patent: Feb. 13, 2018

(54) CONTACT MODULE FOR OPTIMIZING EMITTER AND CONTACT RESISTANCE

(71) Applicant: INTERNATIONAL BUSINESS MACHINES CORPORATION, Armonk, NY (US)

(72) Inventors: James W. Adkisson, Jericho, VT (US); Anthony K. Stamper, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 89 days.

(21) Appl. No.: 14/558,037

(22) Filed: Dec. 2, 2014

(65) Prior Publication Data

US 2016/0155661 A1    Jun. 2, 2016

(51) Int. Cl.

| | |
|---|---|
| *H01L 29/732* | (2006.01) |
| *H01L 29/66* | (2006.01) |
| *H01L 29/423* | (2006.01) |
| *H01L 29/737* | (2006.01) |
| *H01L 29/10* | (2006.01) |

(Continued)

(52) U.S. Cl.
CPC .. *H01L 21/76814* (2013.01); *H01L 21/02063* (2013.01); *H01L 21/8249* (2013.01); *H01L 27/0623* (2013.01); *H01L 29/0821* (2013.01); *H01L 29/1004* (2013.01); *H01L 29/42304* (2013.01); *H01L 29/66272* (2013.01); *H01L 29/66318* (2013.01); *H01L 29/732* (2013.01); *H01L 29/7371* (2013.01); *H01L 23/485* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 4,971,929 A | 11/1990 | D'Anna et al. | |
| 5,583,059 A | 12/1996 | Burghartz | |

(Continued)

OTHER PUBLICATIONS

Stork et al., "Electrical and Microstructural Investigation of Polysilicon Emitter Contacts for High-Performance Bipolar VLSI," IBM Journal of Research and Development, vol. 31, No. 6, 1987, pp. 617-626.

(Continued)

*Primary Examiner* — Hoang-Quan Ho
(74) *Attorney, Agent, or Firm* — David Cain; Andrew M. Calderon; Roberts Mlotkowski Safran Cole & Calderon, P.C.

(57) ABSTRACT

An advanced contact module for optimizing emitter and contact resistance and methods of manufacture are disclosed. The method includes forming a first contact via to a first portion of a first device. The method further includes filling the first contact via with metal material to form a first metal contact to the first portion of the first device. The method further includes forming additional contact vias to other portions of the first device and contacts of a second device. The method further includes cleaning the additional contact vias while protecting the first metal contact of the first portion of the first device. The method further includes filling the additional contact vias with metal material to form additional metal contacts to the other portions of the first device and the second device.

18 Claims, 4 Drawing Sheets

(51) Int. Cl.
*H01L 29/08* (2006.01)
*H01L 23/485* (2006.01)
*H01L 21/768* (2006.01)
*H01L 21/02* (2006.01)
*H01L 21/8249* (2006.01)
*H01L 27/06* (2006.01)

(56) References Cited

U.S. PATENT DOCUMENTS

| | | |
|---|---|---|
| 5,665,614 A | 9/1997 | Hafizi et al. |
| 5,895,975 A | 4/1999 | Lin |
| 5,904,536 A | 5/1999 | Blair |
| 6,534,405 B1 | 3/2003 | Wu |
| 6,830,982 B1 | 12/2004 | Howard et al. |
| 7,112,483 B2 | 9/2006 | Lin et al. |
| 2002/0011648 A1* | 1/2002 | Suzuki ............... H01L 21/743 257/565 |
| 2002/0130370 A1* | 9/2002 | Suzuki ............. H01L 29/41708 257/378 |
| 2004/0227212 A1* | 11/2004 | Goller .............. H01L 21/76838 257/584 |
| 2005/0006724 A1* | 1/2005 | Ehwald ............... H01L 21/8249 257/588 |
| 2005/0032323 A1* | 2/2005 | Chen ................... H01L 29/0821 438/369 |
| 2007/0178683 A1 | 8/2007 | Ramin et al. |
| 2008/0197426 A1* | 8/2008 | Okazaki ............ H01L 21/28097 257/411 |
| 2008/0315267 A1* | 12/2008 | Hampp ........... H01L 21/823807 257/288 |
| 2010/0155896 A1* | 6/2010 | Bock ................... H01L 29/0821 257/587 |
| 2012/0074465 A1* | 3/2012 | Chen ................... H01L 29/7378 257/197 |

OTHER PUBLICATIONS

Candra et al., "A 130nm SiGE BiCMOS Technology for mm-Wave Applications Featuring HBT with f T/f MAX of 260/320 GHz," IEEE Radio Frequency Integrated Circuits Symposium (RFIC), 2013, pp. 381-384.

\* cited by examiner

CONTACT MODULE FOR OPTIMIZING EMITTER AND CONTACT RESISTANCE

FIELD OF THE INVENTION

The invention relates to semiconductor structures and, more particularly, to an advanced contact module for optimizing emitter and contact resistance and methods of manufacture.

BACKGROUND

Many different types of active devices can be formed on a single chip or wafer. These devices can be, for example, field effect transistors (FETs) and bipolar transistors, e.g., NPN type transistors. These different devices can be formed on the same chip or wafer using process similar to mainstream CMOS processes, e.g., deposition, lithography and etching processes. For example, the resistances of the base and collector regions of the bipolar transistors and the contacts (e.g., source and drain) of the FETs can be optimized using the same cobalt or nickel silicide processes.

However, in the process of forming the contact vias (openings) for the bipolar transistors and the FETs, contaminant material can form on the sidewalls of the vias or openings, as well as the contact regions for these devices. For example, oxide can be sputtered onto the sidewalls of the contact vias and silicided contact regions for the FETs and bipolar transistors, as well as on the emitter region of the bipolar transistor. This contaminant can form during contact etch and resist stripping processes where native oxide growth occurs.

A buffered hydrofluoric acid (BHF) process is used to clean the oxide in the emitter region of the bipolar transistor. However, this cleaning process can degrade the contact resistance of the cobalt or nickel silicide region for other contacts, e.g., source and drain contacts for the FETs and the base and collector of the bipolar transistor. On the other hand, a cleaning step used to remove the oxide from the silicide contacts may not be very effective for the emitter region, resulting in a poor contact to the emitter.

SUMMARY

In an aspect of the invention, a method comprises forming at least a first contact via to a first portion of a first device. The method further comprises filling the first contact via with metal material to form a first metal contact to the first portion of the first device. The method further comprises forming at least one contact via to other portions of the first device and of a second device. The method further comprises cleaning the at least one contact via while protecting the first metal contact of the first portion of the first device. The method further comprises filling the at least one contact via with metal material to form least one additional metal contact to the other portions of the first device and the second device.

In an aspect of the invention, a method comprises: forming a first contact via to an emitter region of a first device separately from forming additional contact vias to a silicided base region and collector region of the first device and silicided contacts of a second device; filling the first contact via with metal material to form a first metal contact to the emitter region of the first device separately from filling the additional contact vias with metal material to form additional metal contacts to the silicided base region and collector region of the first device and the silicided contacts of the second device; and cleaning the additional contact vias, while protecting the first metal contact to the emitter region of the first device.

In an aspect of the invention, a structure comprises: a bipolar transistor comprising an emitter region, a base region and a collector region, the emitter region have a different contact than the collector region and the emitter region; and a transistor having metal contacts in electrical contact with silicide regions, the metal contacts being the same as the contact for the collector region and the emitter region.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to an advanced SiGe contact module for optimizing emitter and contact resistance and methods of manufacture. More specifically, the present invention provides a dual formation metallization of damascene contacts or vias, e.g., contacts, to different devices. That is, the processes of the present invention allow individualized contact preparation for emitter and other contacts on the same wafer. In this way, two or more contacts can be formed with different metallization processes or interfaces, for different devices. And, advantageously, the processes herein provide completely separate steps for different contacts thus (i) preventing corrosion during a second contact etch, strip, and clean process, as well as (ii) providing the ability to perform an aqua regia clean after a contact etch down to nickel or cobalt silicide, without damaging the emitter or silicided regions.

The structures of the present invention can be manufactured in a number of ways using a number of different tools. In general, though, the methodologies and tools are used to form structures with dimensions in the micrometer and nanometer scale. The methodologies, i.e., technologies, employed to manufacture the contacts of the present invention have been adopted from integrated circuit (IC) technology. For example, the structures of the present invention are built on wafers and are realized in films of material patterned by photolithographic processes on the top of a wafer. In particular, the fabrication of the contacts of the present invention uses three basic building blocks: (i) deposition of thin films of material on a substrate, (ii) applying a patterned mask on top of the films by photolithographic imaging, and (iii) etching the films selectively to the mask.

Figure 1:
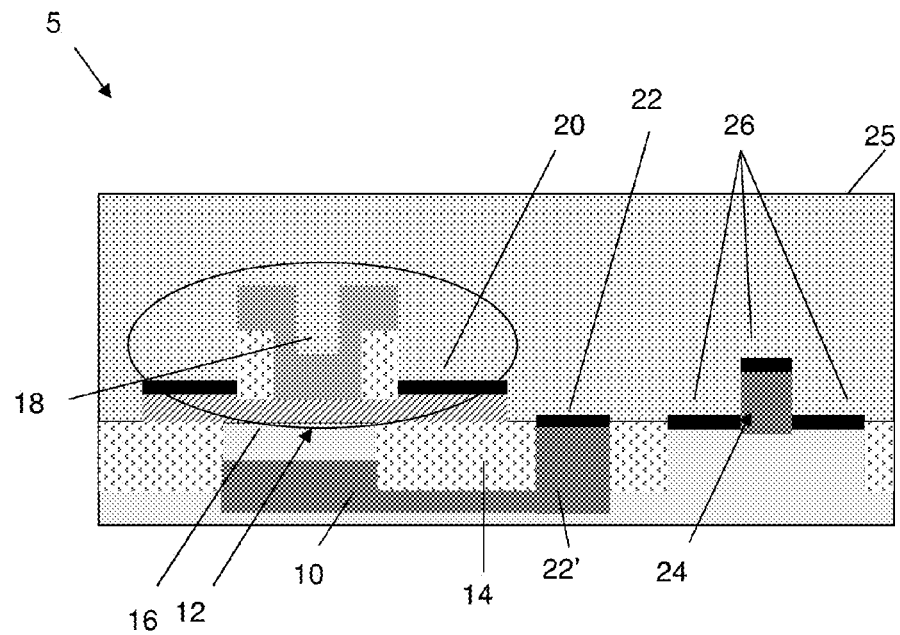
FIGS. 1-5 show structures and respective fabrication processes in accordance with aspects of the invention.

FIG. 1 shows a structure and respective processing steps in accordance with aspects of the present invention. In particular, the structure 5 includes a bipolar transistor 12 formed on a substrate 10. The bipolar transistor 12 includes an emitter region 18, a base contact region 20 and a collector contact region 22 for collector 22'. In embodiments, the substrate 10 can be composed of any suitable material including, but not limited to, Si, SiGe, SiGeC, SiC, GE alloys, GaAs, InAs, InP, and other III/V or II/VI compound semiconductors. In embodiments, the substrate 10 is a p-type substrate.

The bipolar transistor 12 is isolated from other devices, e.g., transistor 24 such as a field effect transistor, by shallow trench isolation (STI) structures 14. The STI structures 14 can be formed using conventional lithography, etching and deposition processes. By way of example, a resist can be formed over the substrate 10 and exposed to energy (light) to form a pattern (openings). An etching process (reactive ion etching (RIE)) with a selective etch chemistry to the material of the substrate 10 can then be performed through the openings. The etching process forms trenches within the substrate 10, which are filled with an insulator layer, e.g., oxide, using conventional deposition methods, e.g., chemical vapor deposition (CVD) processes. After the trenches are filled, the surface of the substrate 10 can be polished by a chemical mechanical polishing (CMP) process.

The bipolar transistor 12 and the transistor 24 or other active devices can be formed on the substrate 10 using conventional deposition of materials, lithography and etching processes, as is known to those of skill in the art such that no further explanation is required for an understanding of the present invention. By way of one non-limiting, illustrative structure, the bipolar transistor 12 can be an NPN transistor. In this implementation, the bipolar transistor 12 can be formed on an epitaxial layer of boron doped SiGe layer 16, as one illustrative example. The bipolar transistor 12 further includes the emitter region 18 formed from deposited and patterned polysilicon material as one illustrative example. The base contact region 20 and the collector contact region 22 are enhanced to lower resistivity using a nickel or cobalt silicide process. In embodiment, the base contact region 20 is formed on the boron doped SiGe layer 16; whereas, the collector contact region 22 is formed over an n-type region on the p-type substrate 10 that is electrically connected to the collector region of the npn transistor. The transistor 24 or other active device can include metallization regions (contacts) 26 also formed by a nickel or cobalt silicide process, for example. In embodiments, the nickel or cobalt silicide processes for the base region 20, the collector region 22 and the contacts 26 can be formed during the same process.

An interlevel dielectric layer 25 is formed on the substrate 10, encapsulating the bipolar transistor 12 and the transistor 24. The interlevel dielectric layer 25 can be an oxide deposited using conventional deposition processes. For example, the interlevel dielectric layer 25 can be deposited using a CVD process.

Figure 2:
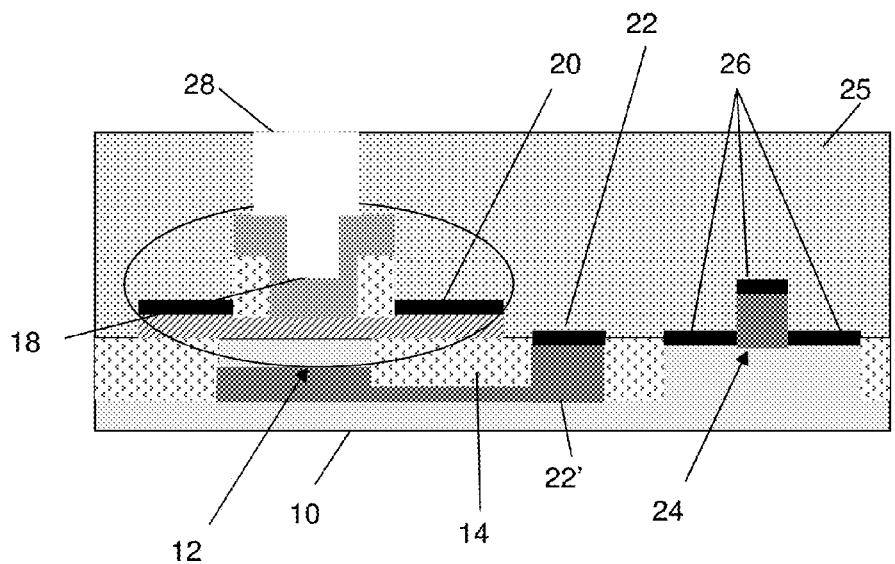

In FIG. 2, a contact via (opening) 28 is formed in the interlevel dielectric layer 25, exposing the underlying emitter region 18. In embodiments, the contact via 28 is formed using conventional lithography and etching processes, aligned to the underlying emitter region 18. After formation of the contact via, the resist can be removed using, e.g., an oxygen ashing process. Prior to the deposition of metal material in the contact via 28, a cleaning process, e.g., wet etch of BHF or dilute hydrofluoric acid (DHF), is performed to remove any excess sputtered oxide which forms on the emitter region 18 during contact etch and resist removal processes. Also, silicided contact regions will not be exposed during this cleaning process, thus ensuring their integrity.

Figure 3:
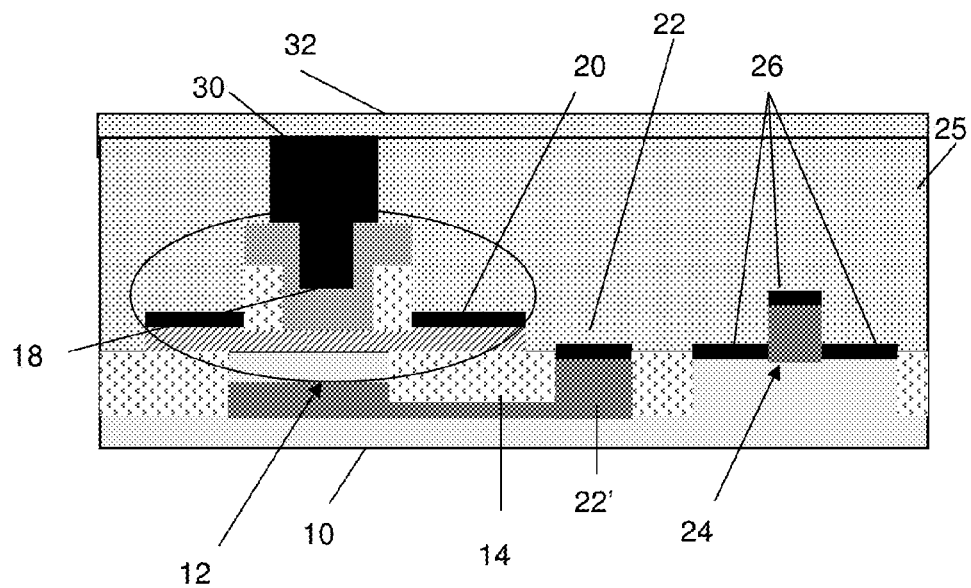

In FIG. 3, a metal material 30, e.g., contact metal, is formed within the cleaned contact via 28. In embodiments, the metal material 30 is tungsten with a Ti and TiN liner material, for example, formed in electrical contact with the emitter region 18. The metal material (contact) 30 can be deposited using a CVD process, followed by a subsequent polishing step, e.g., CMP. Advantageously, the metal material (contact) 30 for the emitter region 18 can be formed separately from contact metals for the base region 20, collector region 22 and metallization regions 26 of the transistor 24. In this way, the processes of the present invention provide the additional flexibility to deposit different materials and/or thickness of materials for the emitter region 18, in contrast to metal contacts for the base region 20, collector region 22 and metallization regions 26 of the transistor 24. Also, as previously described, this process provides the ability to clean a contact via without damaging a previously formed contact or silicided regions.

Still referring to FIG. 3, any excess material formed on the interlevel dielectric layer 25 can be removed using a conventional CMP process. An interlevel dielectric layer 32 can then be formed on the polished surface of the interlevel dielectric layer 25. In embodiments, the interlevel dielectric layer 32 can be deposited using CVD processes, to a thickness of about 1000 Å to about 3000 Å, and preferably about 2000 Å to about 3000 Å. The thickness will vary depending on subsequent removal by etch, cleaning or polish steps. In embodiments, the interlevel dielectric layer 32 can be used to protect the metal material (contact) 30 during subsequent processing, e.g., forming and cleaning of contact vias for the remaining contacts, e.g., silicided regions. More specifically, the interlevel dielectric layer 32 will prevent corrosion during a second contact etch strip, and clean process.

Figure 4:
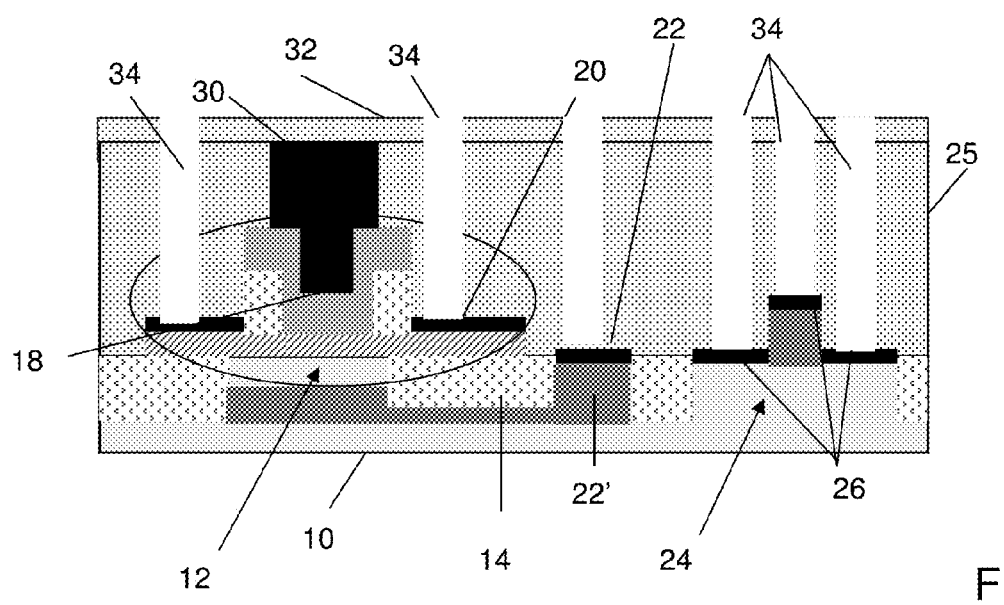

In FIG. 4, contact vias 34 are formed in the interlevel dielectric layer 25, exposing the metallization (silicide contacts) for the base region 20, collector region 22 and metallization regions 26 of the transistor 24. In embodiments, the contact vias 34 are formed using conventional lithography and etching processes, which provide the contact vias 34 to the underlying base region 20, collector region 22 and metallization regions 26 of the transistor 24.

Prior to the metal fill deposition process, the resist can be removed, e.g., by oxygen ashing, and the contact vias 34 can undergo a clean, for example an aqua regia clean (after the contact etch down to nickel or cobalt silicide). In embodiments, the cleaning process includes, e.g., a nickel or cobalt clean with a plasma sputtering preclean process. More specifically, the sputtering preclean process can be a dry clean process (without HF) such as an Argon-based plasma cleaning process suitable to remove contamination via ion bombardment without causing a chemical reaction or oxidation on the surface of the silicided contact regions. Alternatively, a BHF or similar clean could be performed. As the metallization (contact) 30 remains protected by the interlevel dielectric layer 32, the cleaning process of the contact vias 34 will not affect, e.g., damage, the metal material (contact) 30 or the emitter region 18.

Figure 5:
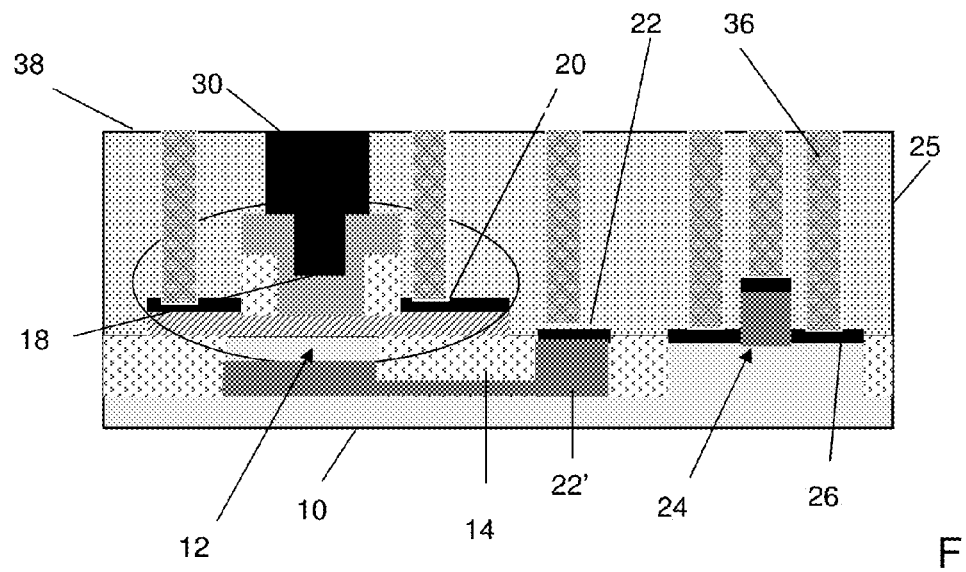

In FIG. 5, a metal material 36, e.g., contact, is formed within the contact vias 34. In embodiments, the metal material 36 is tungsten with a Ti and TiN liner material, for example; although other materials are also contemplated by the present invention. The metal material (contacts) 36 can be deposited using a CVD process, followed by a subsequent polishing step, e.g., CMP. The metal material (contacts) 36 can be formed in electrical contact with the base contact region 20, collector contact region 22 and metallization regions 26, e.g., silicided contact regions. Advantageously, the metal material (contacts) 36 can be formed separately from metal material (contacts) 30 for the emitter region 18. In this way, the processes provide the flexibility to deposit different materials and/or thickness of materials or combinations thereof for the base region 20, collector region 22 and metallization regions 26 of the transistor 24, in contrast to the emitter region 18.

Still referring to FIG. 5, any excess metal material formed on the interlevel dielectric layer 32 can be removed using a conventional CMP process. The CMP process, in conjunction with any other cleans or etches, will also remove the dielectric material 32, itself, resulting in a planar surface 38, as well as exposing the metal materials (contacts) 30 and 36.

Figure 6:
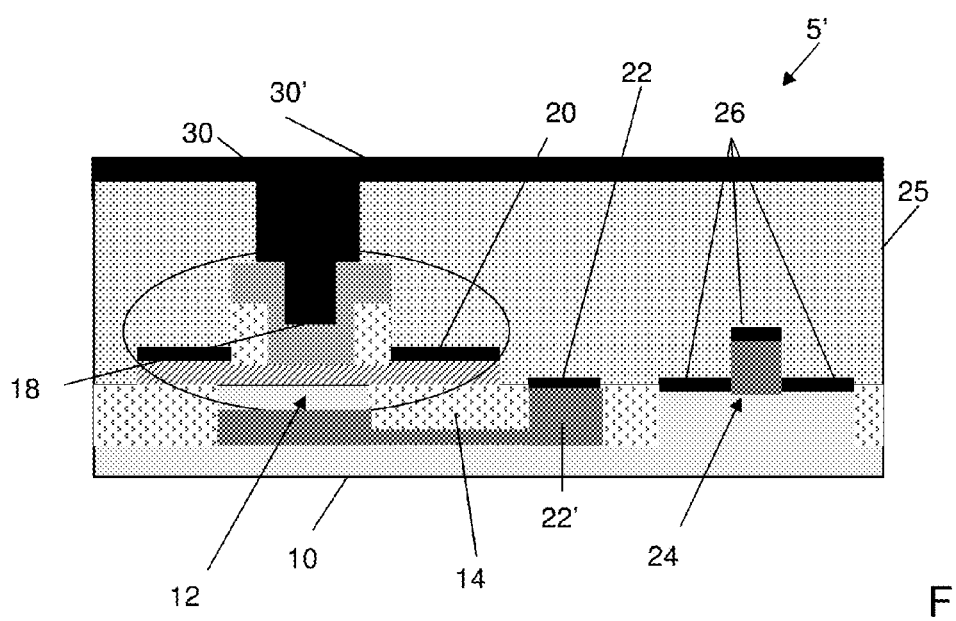
FIGS. 6 and 7 show structures and respective fabrication processes in accordance with additional aspects of the invention.

It is important to note that the metallization process, e.g., via formation, silicide processes (forming the contact region 20, collector contact region 22 and metallization regions 26) and subsequent metal fill process for electrically connecting to the base contact region 20, collector contact region 22 and metallization regions 26 can be performed prior to the formation of the contact metal 30 for the emitter region 18 by simply reversing processes. Thus, the processes noted in FIGS. 1, 4 and 5 can be formed prior to the processes noted in FIGS. 2 and 3, or vice versa. This also holds true for the other embodiments described herein such that the mere recitation of one contact forming process prior to the other contact forming process should not impart limitations to the claimed invention. FIG. 6 shows another structure and respective processing steps in accordance with aspects of the present invention. In particular, the structure 5' includes the bipolar transistor 12 formed on the substrate 10. As in the previous embodiment, the substrate 10 can be a p-type substrate composed of any suitable material including, but not limited to, Si, SiGe, SiGeC, SiC, GE alloys, GaAs, InAs, InP, and other III/V or II/VI compound semiconductors. As previously described, the bipolar transistor 12 is isolated from other devices, e.g., transistor 24, by shallow trench isolation (STI) structures 14, formed using conventional lithography, etching and deposition processes.

The bipolar transistor 12 and the transistor 24 or other active devices can be formed on the substrate 10, using conventional deposition of materials, lithography and etching processes, as is known to those of skill in the art such that no further explanation is required for an understanding of the present invention. The bipolar transistor 12 can be formed on an epitaxial layer of boron doped SiGe layer 16, as one illustrative example. The bipolar transistor 12 further includes the emitter region 18, the base contact region 20 (with a nickel or cobalt silicide contact) and the collector contact region 22 (with a nickel or cobalt silicide contact). The transistor 24 or other active device can include metallization regions (contacts) 26, formed by a nickel or cobalt silicide process. An interlevel dielectric layer 25, e.g., oxide, is formed on the substrate 10, encapsulating the bipolar transistor 12 and the transistor 24.

As shown further in FIG. 6, a metal material 30, e.g., contact, is formed within the contact via 28, electrically contacting the emitter region 18. In embodiments, the metal material (contact) 30 is tungsten with a Ti and TiN liner material, for example. The material of the metal material (contact) 30 can be deposited using a CVD process. In this implementation, the contact via can be cleaned prior to the formation of the contact vias for the remaining contacts. In this way, a BHF or DHF cleaning process can be used for the emitter region 18, which will not affect any silicided contact regions. Also, in this implementation, excess metal material 30' remains on the surface of the interlevel dielectric layer 25; that is, the structure does not undergo a subsequent polishing step, e.g., CMP, after the formation of the metal material (contact) 30. This metal material 30' will help protect the metal material (contact) 30 which contacts the emitter region 18.

Figure 7:
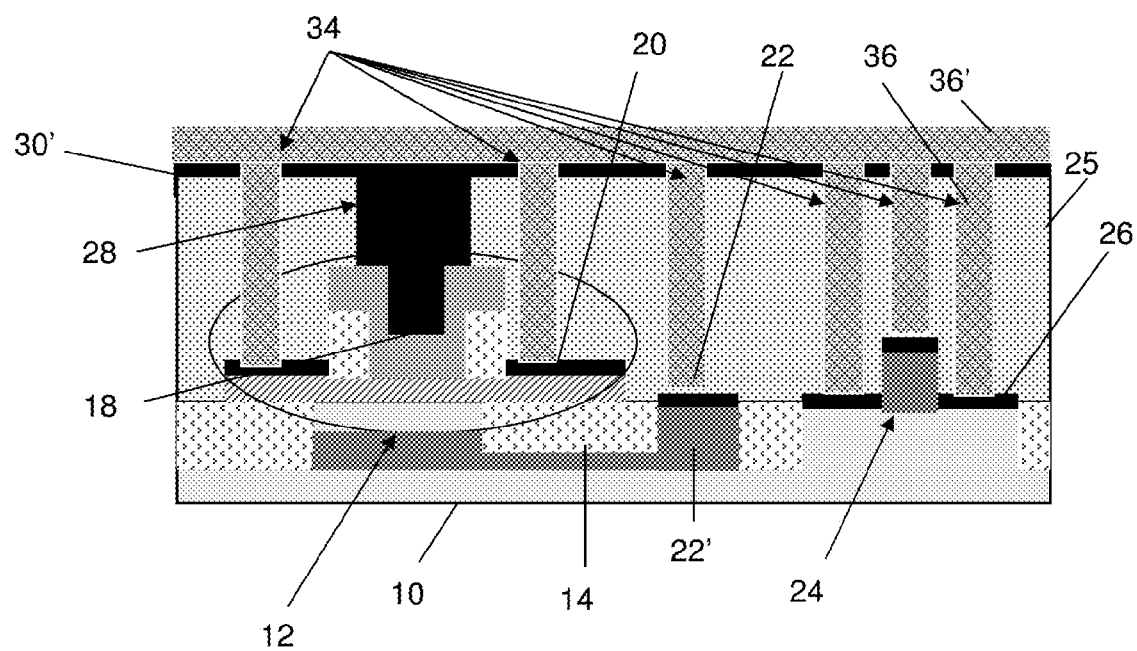

In FIG. 7, contact vias 34 are formed in the interlevel dielectric layer 25, exposing the metallization (silicide contacts) for the base region 20, collector region 22 and metallization regions 26 of the transistor 24. As in previous aspects of the invention, the contact vias 34 are formed using conventional lithography and etching processes, which will now provide openings to the underlying base region 20, collector region 22 and metallization regions 26 of the transistor 24 through the layer of metallization 30'. In this aspect, the etchant chemistries will etch through the layer of metallization 30'.

Prior to the fill material deposition process, the contact vias 34 can undergo a cleaning process, e.g., a dry clean process such as an Argon-based plasma cleaning process as already described herein. As the metallization (contact) 30 remains protected by the metallization layer 30', the cleaning process of the contact vias 34 will not affect, e.g., damage, the metal material (contact) 30 or the emitter region 18.

A metal material 36, e.g., contact, is formed within the via contacts 34. In embodiments, the metal material (contacts) 36 is tungsten with a Ti and TiN liner material, for example. The metal material (contacts) 36 can be deposited using a CVD process, which will form a layer of material 36' over the metallization 30'. The metallization processes are followed by a subsequent polishing step, e.g., CMP, to remove the metal layers 30' and 36', thereby forming the structure shown in FIG. 5. That is, any excess material 30' and 36' can be removed using a conventional CMP process, to form a planar surface 38 and expose the contacts 30 and 36.

Advantageously, the metal material (contacts) 36 can be formed separately from metal material (contact) 30 for the emitter region 18. In this way, the processes of the present invention provide the flexibility to deposit different materials and/or thickness of materials or combinations thereof for the emitter region 18 and for the base region 20, collector region 22 and metallization regions 26 of the transistor 24.

It should be understood by those of skill in the art that in any of the embodiments, the contact vias and contact metal material formed within the contact vias for the base region 20, collector region 22 and metallization regions 26 of the transistor 24 can be performed prior to the formation and filling of the contact via for the emitter region 18, or vice versa. In any of the different scenarios, the formation of these contact vias for these different regions are formed and cleaned separately, prior to a separate metal fill process. This ensures that the cleaning processes of the emitter will not damage the silicided contact regions.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
a bipolar transistor comprising an emitter region, a base region and a collector region, a contact in direct electrical contact on a non-silicided region of the emitter region which is different than contacts of the collector region and the base region, the contacts of the collector region and the base region are in electrical contact with silicide regions of the collector region and the base region; and
a transistor having contacts in electrical contact with silicide regions, the contacts being the same as the contacts for the collector region and the base region,
wherein the bipolar transistor and the transistor are formed on a same substrate; and
the silicide region of the base region is directly on a top surface of an epitaxial layer that is directly on a top surface of the substrate.

2. The structure of claim 1, wherein the bipolar transistor is an NPN transistor.

3. The structure of claim 2, wherein the NPN transistor is provided on the epitaxial layer which comprises boron doped SiGe.

4. The structure of claim 1, wherein the emitter region is polysilicon.

5. The structure of claim 4, wherein the base region includes a base contact region and the collector region includes a collector contact region, both of nickel silicide.

6. The structure of claim 4, wherein the base region includes a base contact region and the collector region includes a collector contact region, both of cobalt silicide.

7. The structure of claim 4, wherein:
the epitaxial layer comprises boron doped SiGe;
the substrate is a p-type substrate;
the base region has a base contact region which is formed on the epitaxial layer; and
the collector region has a collector contact region which is formed over an n-type region on the p-type substrate that is electrically connected to the collector region of the bipolar transistor.

8. The structure of claim 1, wherein the contact is metal material of tungsten with a Ti and TiN liner material in electrical contact with the emitter region.

9. The structure of claim 1, wherein the substrate is a p-type substrate.

10. The structure of claim 9, wherein the bipolar transistor is isolated from the transistor by a shallow trench isolation structure.

11. The structure of claim 10, wherein the bipolar transistor is formed on the epitaxial layer, which comprises a boron doped SiGe layer, and the emitter region is polysilicon material.

12. The structure of claim 11, wherein the silicide regions of the base region, the collector region and the transistor are nickel silicide or cobalt silicide.

13. The structure of claim 12, wherein the base region has a base contact region formed on the boron doped SiGe layer and the collector region has a collector contact region formed over an n-type region on the p-type substrate that is electrically connected to the collector region.

14. The structure of claim 1, wherein the silicide region of the collector region is on the top surface of the substrate.

15. The structure of claim 14, wherein the silicide region of the collector region and at least one of the silicide regions of the transistor are at a same vertical height relative to the top surface of the substrate.

16. The structure of claim 15, wherein:
the epitaxial layer comprises boron doped SiGe;
a portion of the epitaxial layer is directly on a top surface of a shallow trench isolation structure formed in the substrate; and
the top surface of the substrate is coplanar with the top surface of the shallow trench isolation structure.

17. The structure of claim 16, wherein the contact of the collector is between the contact of the emitter and the contacts of the transistor in a horizontal direction.

18. The structure of claim 17, wherein one of the contacts of the base is between the contact of the emitter and the contact of the collector in a horizontal direction.

* * * * *